United States Patent [19]

Imagawa

[11] Patent Number: 5,179,727
[45] Date of Patent: Jan. 12, 1993

[54] AUTOMATIC ADJUSTING CIRCUIT FOR AN ANALOG FILTER

[75] Inventor: Yasumi Imagawa, Kanazawa, Japan

[73] Assignee: Kabushiki Kaisha Toshiba, Kawasaki, Japan

[21] Appl. No.: 478,577

[22] Filed: Feb. 12, 1990

[30] Foreign Application Priority Data

Feb. 16, 1989 [JP] Japan .................... 1-36480

[51] Int. Cl.$^5$ .................. H04B 17/02; H04B 1/16
[52] U.S. Cl. .................. 455/182.3; 455/192.3; 455/340; 333/17.1; 358/38
[58] Field of Search ........... 455/254, 266, 268, 227, 455/286, 289, 306, 307, 339, 340, 182, 164, 192, 182.3, 164.1, 192.3; 333/17.1; 358/38

[56] References Cited

U.S. PATENT DOCUMENTS

| 2,964,712 | 12/1960 | Dean et al. |  |
|---|---|---|---|
| 3,473,128 | 10/1969 | Kiser |  |
| 3,867,712 | 2/1975 | Harthill et al. | 333/17.1 |
| 4,192,970 | 3/1980 | Kahn | 455/307 |
| 4,395,779 | 7/1983 | Fujino et al. | 333/17.1 |
| 4,551,755 | 11/1985 | Matsuda et al. | 455/266 |
| 4,816,770 | 3/1989 | Naumann | 455/266 |
| 5,051,703 | 9/1991 | Idogawa et al. | 455/307 |

FOREIGN PATENT DOCUMENTS

| 0158231 | 3/1985 | European Pat. Off. |  |
|---|---|---|---|
| 56-68014 | 8/1981 | Japan | 333/17.1 |

OTHER PUBLICATIONS

A copy of the European Search Report.
Patent Abstracts of Japan, vol. 12, No. 435 (E-683).

Primary Examiner—Reinhard J. Eisenzopf
Assistant Examiner—Lisa Charouel
Attorney, Agent, or Firm—Banner, Birch, McKie & Beckett

[57] ABSTRACT

The center frequency of each of the analog filters with different selectivities each other installed in an automatic adjusting circuit is automatically adjusted in accordance with a bias input signal which is generated by the phases detectors respectively associated with the analog filters in accordance with a frequency difference, so as to be equal to the reference frequency of an input signal applied to the two analog filters. The bias input signal is fed to an analog filter to be controlled, which is formed on the same chip as that of the above two filters. A coarse adjustment is based on the output signal of the phase detector associated with the analog filter with a low selectivity. A fine adjustment is based on the output signal of the phase detector associated with the analog filter with a high selectivity. An accuracy of matching the center frequency to the reference frequency is determined by both the selectivity of the analog filter with a high selectivity and the ratio of the output signals of the two phase detectors in the automatic adjusting circuit.

8 Claims, 3 Drawing Sheets

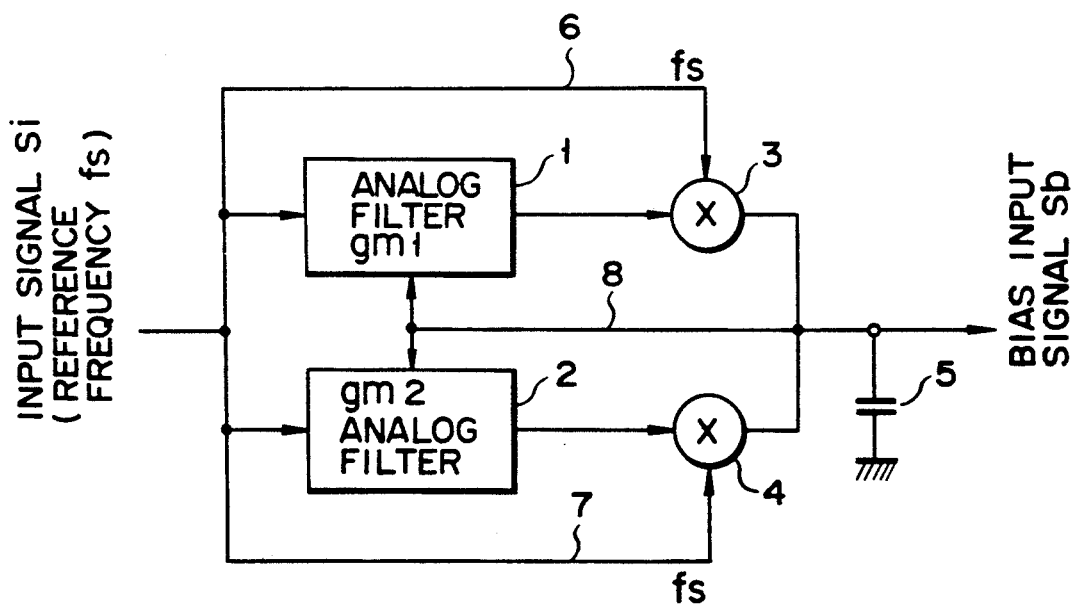
F I G. 2

AUTOMATIC ADJUSTING CIRCUIT FOR AN ANALOG FILTER

BACKGROUND OF THE INVENTION

1. Field of the Invention

The present invention relates to an automatic adjusting circuit for an analog filter used in an analog signal processing, and, more particularly, to an automatic adjusting circuit for automatically adjusting a center frequency of an analog filter with a high accuracy to be exactly equal to a reference frequency of an input signal.

2. Description of the Related Art

A conventional automatic adjusting circuit for an analog filter used in an analog phase synchronization loop circuit in a color sub-carrier signal system at 3.58 MHz of a color television receiver, for example, is arranged as shown in FIG. 1. In a semiconductor integrated circuit shown, reference numeral 41 designates an analog filter of a variable gain type, which receives an input signal Si of a reference frequency fs. The center frequency "fo" of the analog filter 41 is varied by controlling its gain (gm) in accordance with a bias input signal. The analog filter 41 is a low-pass filter, for example. A phase detector 42, which is made up of a multiplier, for example, phase detects an output signal of the analog filter 41 with reference to the input signal Si that is fed through a signal line 45, and outputs a component signal which depends on a phase difference. A smoothing capacitor 43, which is externally coupled with the integrated circuit, is for smoothing the output signal of the phase detector 42 to thus convert it into a DC signal. The phase detected output signal as the DC signal is fed back as a fine adjusting bias input signal to the analog filter 41 through a feedback loop 46. A variable resistor 44, which is externally coupled with the integrated circuit, is for applying a coarse adjusting bias input to the analog filter 41.

In the automatic adjusting circuit for the analog filter, in order to adjust the filter characteristic of the analog filter 41 s that the center frequency "fo" of the analog filter 41 is equal to the reference frequency "fs" of the input signal Si, first a coarse adjustment is made so that the center frequency "fo" of the analog filter 41 falls within a predetermined range with respect to the reference frequency "fs", by manually adjusting the external variable resistor 44. Then, the phase detector 42 automatically executes a fine adjustment of the analog filter 41 by its output signal.

However, the manual operation for the filter characteristic adjustment is attendant with many drawbacks. In particular, the adjusting work is very troublesome. Further, in case that the filter characteristic of the analog filter after adjusted is deviated from the correct one, it is often impossible to adjust such filter characteristic. Furthermore, since the variable resistor 44 is the part externally coupled with the integrated circuit, an operator will feel inconvenient in using the integrated circuit.

To make an automatic adjustment of the filter characteristic of the analog filter 41 over a broad frequency band, the frequency band must be broadened by lowering the selectivity Q of the filter. Therefore, it is impossible to make an exact fine adjustment of the filter characteristic.

In case where the analog filter 41 is a filter of a high selectivity Q, it is necessary to previously adjust and set the center frequency "fo" of the analog filter 41 in the vicinity of the reference frequency "fs" before an automatic fine adjustment. Also in this case, there still exist the drawback of the troublesome manual adjustment work and the drawback of frequently failing to take a countermeasure for the deviation of the adjusted filter characteristic.

As described above, the conventional automatic adjusting circuit for an analog filter has the following drawbacks. 1) Since the filter characteristic must be manually adjusted, the adjusting work is delicate and troublesome. 2) When, after adjusted, the filter characteristic is deviated from the correct one, there is a case that no measure can be taken for the deviated filter characteristic. 3) Since the variable resistor 44 is needed as the part externally coupled with the integrated circuit, a designer will feel inconvenient in circuit design using the integrated circuit. 4) To make an automatic adjustment of the analog filter over a broad frequency band, the frequency band must be broadened by lowering the selectivity Q of the filter. Accordingly, it is impossible to make a fine adjustment of the filter characteristic with a high accuracy.

SUMMARY OF THE INVENTION

Accordingly, an object of the present invention is to provide a automatic adjusting circuit for an analog filter which provides a complete automatic adjustment for making the center frequency "fo" of the controlled filter equal to the reference frequency "fs" of the input signal by using analog filters formed in a same chip as that of the filter to be controlled, that realizes a so-called adjustment-free technique.

Another object of the present invention is to provide an automatic adjusting circuit for an analog filter which provides an automatic adjustment of the filter characteristic of an analog filter over a broad range of frequencies.

Yet another object of the present invention is to provide an automatic adjusting circuit for an analog filter which can readily be fabricated into an integrated circuit, thereby improving a convenience in handling.

To achieve the above objects, there is provided an automatic adjusting circuit for an analog filter for automatically adjusting the center frequency of an analog filter to be controlled to a predetermined ratio with respect to a reference frequency of an input signal by automatically adjusting the center frequency of analog filters contained i the automatic adjusting circuit to be equal to the reference frequency of the input signal, comprising:

two analog filters for receiving the input signal of the reference frequency respectively and having different selectivities each other, the center frequencies of the analog filters being respectively varied in accordance with bias input signals applied thereto;

two phase detectors correspondingly coupled with the two analog filters, each of the phase detectors comparing a phase of the input signal with a phase of an output signal of the corresponding analog filter, and producing a signal based on a phase difference between the input signal and the output signal; and a bias input signal generating circuit for generating a bias input signal by composing the output signals of the two phase detectors and converting the composed signal into a DC signal, the bias input signal generating circuit feeding back the bias input signal to the two analog filters and feeding the same to the analog filter to be controlled.

With such an arrangement, in order that the center frequencies of the analog filters with different selectivities in the automatic adjusting circuit are each equal to the reference frequency of the input signal to the analog filters, the center frequencies of the analog filter in the automatic adjusting circuit are automatically adjusted by the bias input signal that is generated by the phase detectors in accordance with the frequency differences. At the same time, the bias input signal is fed to the analog filter to be controlled that is formed on a single chip in which the automatic adjusting circuit is also formed. A coarse adjustment is made on the basis of an output signal of the phase detector provided in connection with the analog filter with a low selectivity. A fine adjustment is made on the basis of an output signal of the phase detector provided in connection with the analog filter with a high selectivity. An accuracy of matching the center frequency of the analog filter to be controlled to the reference frequency of the input signal, is determined by both the selectivity of the analog filter with a high selectivity and the ratio of the output signals of the two phase detectors in the automatic adjusting circuit Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 2 is a circuit diagram showing an arrangement of an automatic adjusting circuit for an analog filter according to an embodiment of the present invention;

DETAILED DESCRIPTION OF THE PREFERRED EMBODIMENT

Figure 1:
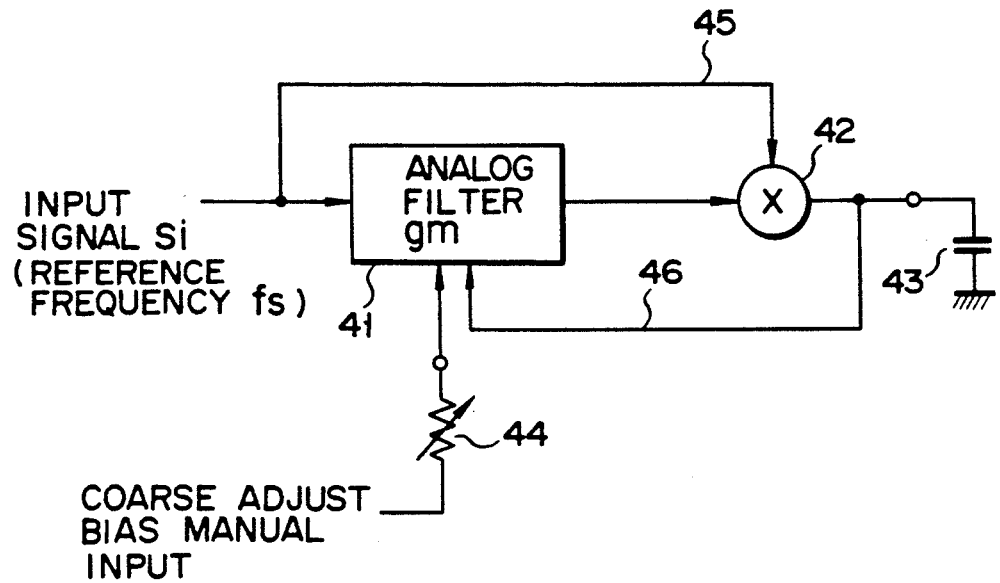
FIG. 1 is a circuit diagram showing an arrangement of an automatic adjusting circuit for an analog filter of the prior art.

There will now be described an embodiment of this invention with reference to the accompanying drawings.

FIG. 2 shows an automatic adjusting circuit for an analog filter, which is used in an analog phase synchronization loop circuit of a color sub-carrier signal system at 3.58 MHz of a color television receiver, for example.

In the automatic adjusting circuit for an analog filter, two analog filters 1 and 2 with different selectivities Qs are of the gain (gm) variable type and are incorporated into the semiconductor integrated circuit. Those analog filters 1 and 2 are respectively coupled for reception with an input signal Si of the reference frequency "fs". The center frequencies "fo" of the analog filters 1 and 2 are respectively varied in accordance with bias input signals applied thereto. Two phase detectors 3 and 4 which are made of multipliers, for example, are correspondingly coupled with the two analog filters 1 and 2. Each of the phase detectors compares a phase of the input signal Si with a phase of an output signal of the corresponding analog filter, and produces a signal based on a phase difference between the input signal Si and the output signal of the corresponding analog filter. The output signals of the two phase detectors 3 and 4 are combined, and the composite signal is converted into a DC signal. The resultant signal is fed back as a bias input signal to the analog filters 1 and 2 through a feedback loop 8. A bias input signal generating circuit includes a smoothing capacitor 5 externally coupled with the semiconductor integrated circuit. The capacitor 5 smoothes the signal resulting from composing the output signals of the two phase detectors 3 and 4.

The two analog filters 1 and 2 are respectively, for example, low-pass filters with different selectivities each other. The selectivity Q of the analog filter 1 is set to low, e.g., 0.3 and that of the analog filter 2 is set to high, e.g., 3. The frequency range for the coarse adjustment is determined by the selectivity Q of the analog filter 1 whereas the adjusting accuracy is determined by the selectivity Q of the analog filter 2. A detected output ratio, or a ratio of the detected output currents of the phase detectors 3 and 4, is set at 1:5, for example. The reason is that the output signal of the analog filter 1 may be used only for starting the automatic adjusting circuit while the output signal of the analog filter 2 dominantly makes a commitment to the control of the automatic adjusting circuit during operation.

An accuracy of matching the center frequency "fo" of the analog filter to be controlled to the reference frequency "fs" of the input signal, is determined by the selectivity Q of the analog filters 2 and the ratio of the detected output signals of the two phase detectors 3 and in the automatic adjusting circuit.

An operation of the automatic adjusting circuit for an analog filter according to the present invention will be described with reference to FIGS. 3, 4 and 5.

Figure 3:
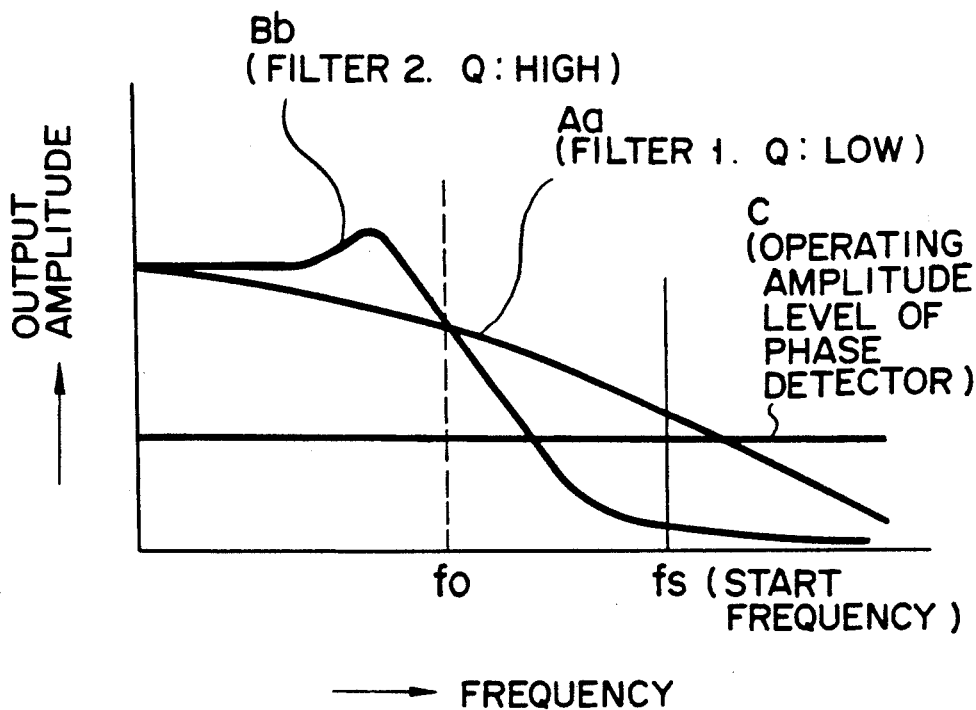
FIG. 3 is a graphical representation of output amplitude vs. frequency characteristics of analog filters, which is useful for explaining the operation of the automatic adjusting circuit according to the present invention.

As shown in FIG. 3, a curve "Aa" representative of a variation of an amplitude of an output signal of the analog filter 1 with a low selectivity gradually falls off as the frequency is increased. A curve "Bb" representative of a variation of an amplitude of an output signal of the analog filter 2 with a high selectivity Q abruptly falls off immediately before the frequency "fs" of the input signal. As shown in FIG. 4, a curve "A" representative of a variation of an output phase of the phase detector 3, which is coupled with the analog filter 1 with a low selectivity Q, gradually falls off as the frequency is increased. A curve "B" representative of a variation of an output phase of the phase detector 4, which is coupled with the analog filter 2 with a high selectivity Q, abruptly falls off in the vicinity of the center frequency "fo". In FIG. 4, the curves A and B are both plotted under a condition that the center frequency "fo" is coincident with the reference frequency "fs" of the input signal. As seen from the figure, a variation width of phase of the analog filter 1 is broad and hence an adjustable frequency band is also broad. Usually, the adjustable frequency band of the analog filter 1 is set in the range between 0.6 fo and 1.4 fo. On the other hand, an adjustable frequency band of the analog filter 2 is narrow.

To order that the phase detectors 3 and 4 operate to generate the output signals, the amplitude of the input signal must be above a predetermined level as indicated by a straight line C in FIG. 3. When the automatic adjusting circuit starts under a condition that the center frequencies "fo" of the analog filters 1 and 2 are at a start frequency shown in FIG. 3, the amplitude of the output signal of the analog filter 2 is small and accordingly the phase detector 4 associated therewith cannot be operated with the output signal. On the other hand, the amplitude of the output signal of the analog filter 1 whose selectivity Q is low is in excess of the line C. Accordingly, the phase detector 3 can produce a bias input signal Sb and applies it to the analog filters 1 and 2 by way of the feedback loop 8. By the bias input signal, the filters 1 and 2 are coarsely adjusted and the center frequencies "fo" gradually approach to the reference frequency "fs". Thus, the analog filter 1 and the phase detector 3 serve as a starter for the automatic adjusting circuit. In case the center frequency "fo" approaches to the reference frequency "fs", and the amplitude of the output signal of the analog filter 2 exceeds the level of the line C, the phase detector 4 also starts to generate a bias input signal Sb.

Figure 4:
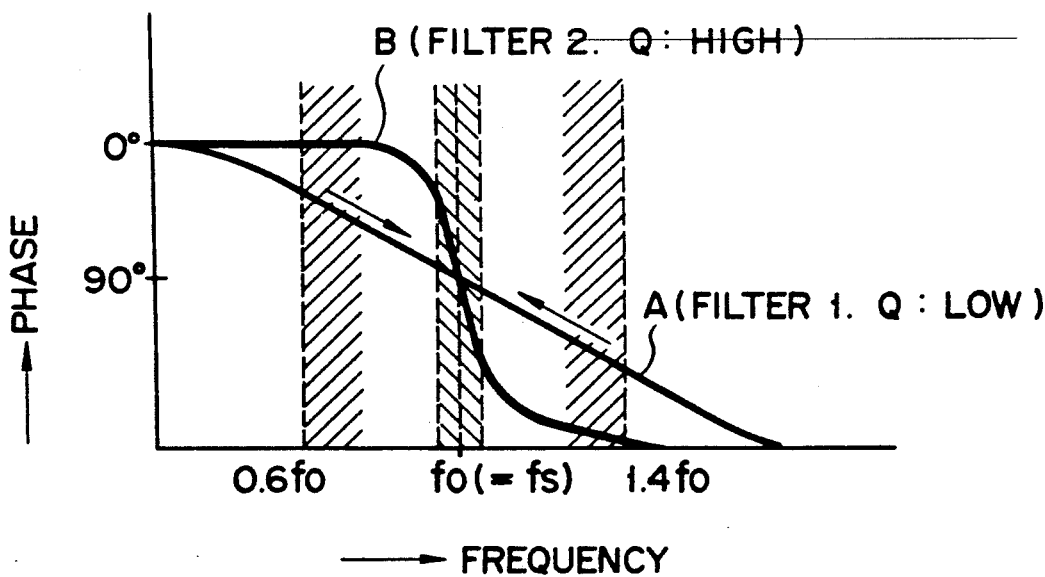
FIG. 4 is a graphical representation of phase vs. frequency characteristics of the phase detectors, which is useful for explaining the operation of the automatic adjusting circuit according to the present invention.

As seen from the phase vs. frequency characteristic of the phase detectors in FIG. 4, at a start point where the center frequencies "fo" of the analog filters are separated from the reference frequency "fs" by a predetermined value of frequency within the broad adjustable frequency band of the analog filter 1, the phase detector 4 does not produce a bias input signal Sb while the phase detector 3 produces it. The bias input signal Sb of the phase detector 3 is fed back to the analog filters 1 and 2. A coarse adjustment is performed in which the center frequencies "fo" of the analog filters 1 and 2 are made to approach to the vicinity of the reference frequency "fs" of the input signal. When, through the coarse adjustment, the center frequencies "fo" enter the narrow adjustable frequency range of the analog filter 2 whose selectivity Q is high, the output signal of the phase detector 4 associated with the analog filter 2 greatly changes even for a slight difference between those frequencies. Under this condition, the feedback control based on the output signal of the phase detector 4 is predominant. Therefore, a fine adjustment to make the center frequencies "fo" of the analog filters 1 and 2 equal to the reference frequency "fs" of the input signal, can be executed with a high accuracy.

Figure 5:
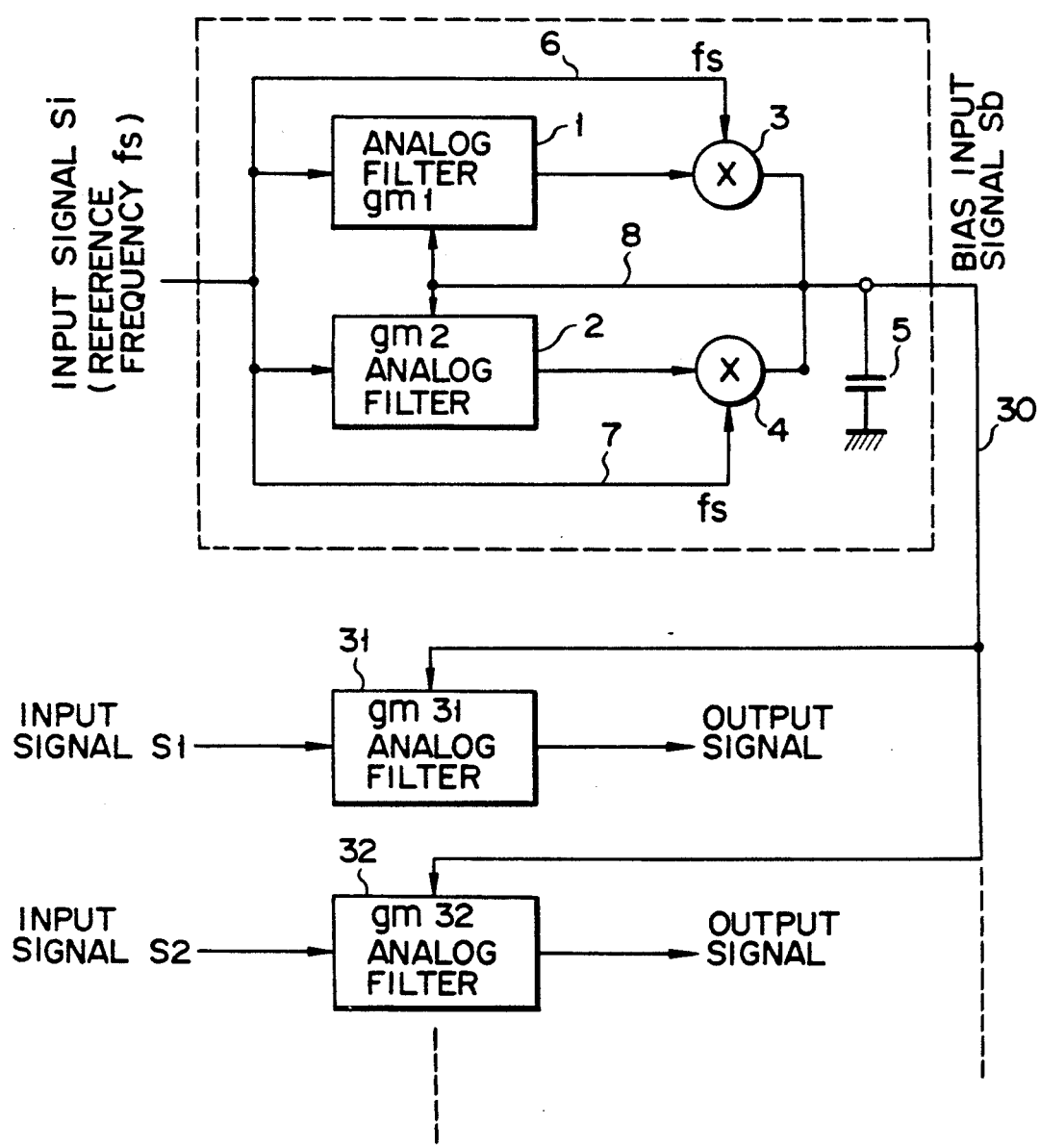
FIG. 5 is a circuit diagram showing a connection of the automatic adjusting circuit according to the present invention with analog filters to be controlled.

As shown in FIG. 5, the automatic adjusting circuit for an analog filter is fabricated simultaneously as an integrated circuit on a same chip as that of one or a plurality of analog filters 31, 32, ... to be controlled. The analog filters 31, 32, ... are designed such that even if the absolute values of resistors R1, R2, ... and capacitors C1, C2, ... of the filters are not uniform, the time constants 1/R1C1, 1/R2C2, ... vary at the same rate as that of the time constant 1/RC of the analog filters 1 and 2 of the automatic adjusting circuit. The reference frequency "fs" is given by the following equation.

$$fs = \alpha \frac{1}{RC}$$

where, $\alpha$ is a constant, $$\therefore \alpha = RCfs$$

The center frequency "fo31" of the analog filter 31 is given as follows.

$$fo31 = \alpha \frac{1}{R1C1}$$

$$= \frac{RC}{R1C1} fs$$

Also, the center frequency "fo32" of the analog filter 32 is given as follows.

$$fo32 = \frac{RC}{R2C2} fs$$

When a bias input signal Sb is fed from the automatic adjusting circuit through the feedback loop 30 to the analog filters 31, 32, ..., if the reference frequency "fs" is not contained in the input signals S1, S2, ... to the analog filters 31, 32, ..., the center frequency "fo" of each of the analog filters 31, 32, ... is automatically adjusted to be equal to the predetermined ratio with respect to the reference frequency "fs".

As described above, an automatic adjusting circuit for an analog filter according to the present invention is capable of executing a complete automatic adjustment of the filter characteristic so that the center frequency "fo" of each of the analog filters 31, 32, ... is equal to the predetermined ratio with respect to the reference frequency "fs". That is, a so-called adjustment-free technique can be obtained. Further, it is capable of executing an automatic adjustment of the filter characteristic of an analog filter over a broad range of frequencies. Furthermore, the automatic adjusting circuit can readily be fabricated into an integrated circuit, thereby providing a convenience in haudling.

Additional advantages and modifications will readily occur to those skilled in the art. Therefore, the invention in its broader aspects is not limited to the specific details, representative devices, and illustrated examples shown and described. Accordingly, departures may be made from such details without departing from the spirit or scope of the general inventive concept as defined by the appended claims and their equivalents.

What is claimed is:

1. An automatic adjusting circuit for generating a bias signal to automatically adjust a center frequency of a controlled analog filter to a predetermined ratio of a reference frequency, said automatic adjusting circuit comprising:

a first analog filter having a first selectivity, said first analog filter having a first input terminal receiving an input signal having the reference frequency and a second input terminal receiving the bias signal to control a center frequency of said first analog filter to be equal to said reference frequency;

a second analog filter having a second selectivity different than the first selectivity, said second analog filter having a first input terminal receiving the input signal, and a second input terminal receiving the bias signal to control a center frequency of said analog filter to be equal to said reference frequency;

a first phase detector for comparing a phase of said input signal with a phase of an output signal of said first analog filter and producing a first output signal;

a second phase detector for comparing a phase of said input signal with a phase of an output signal of said second analog filter and producing a second output signal; and combining means for combining the first and second output signals to generate the bias signal; and a circuit output outputting the bias signal to said controlled analog filter.

2. The automatic adjusting circuit according to claim 1, wherein said first and second analog filters of said automatic adjusting circuit and said controlled analog filter are all formed on a single chip.

3. The automatic adjusting circuit according to claim 1, wherein time constants of said first and second analog filters of said automatic adjusting circuit vary at a same rate as a time constant of said controlled analog filter.

4. The automatic adjusting circuit according to claim 1, wherein said second analog filter has a selectivity which is higher than the selectivity of said first analog filter, a value of said second output signal is greater than a value of said first output signal, and a ratio of said first and second output signal values is set to a predetermined value.

5. The automatic adjusting circuit according to claim 1 wherein said combining means includes a common connection for combining the first and second output signals into the bias signal and a smoothing capacitor connected between the common connection and a ground potential, wherein a feedback path extends from the common connection to the second input terminals of said first and second analog filters for supplying the bias signal thereto.

6. The automatic adjusting circuit according to claim 1, wherein the center frequencies of said first and second analog filters of said automatic adjusting circuit vary at a same rate as the center frequency of said controlled analog filter.

7. The automatic adjusting circuit according to claim 1, wherein said first and second phase detectors include multipliers.

8. The automatic adjusting circuit according to claim 1, wherein the first selectivity is 0.3 and the second selectivity is 3.

* * * * *